United States Patent
Cartlidge et al.

(10) Patent No.: US 6,664,528 B1
(45) Date of Patent: Dec. 16, 2003

(54) IMAGING SYSTEM AND METHODOLOGY EMPLOYING RECIPROCAL SPACE OPTICAL DESIGN

(75) Inventors: Andrew G. Cartlidge, Palm Beach Gardens, FL (US); Howard Fein, Richmond Heights, OH (US)

(73) Assignees: Palantyr Research, LLC, Cleveland, OH (US); Angkor Technology, LLP, Cleveland, OH (US); Himanshu S. Amin, Twinsburg, OH (US); Daniel B. Bortnick, Mentor, OH (US); Gregory Turocy, Westlake, OH (US)

( * ) Notice: Subject to any disclaimer, the term of this patent is extended or adjusted under 35 U.S.C. 154(b) by 22 days.

(21) Appl. No.: 09/900,218

(22) Filed: Jul. 6, 2001

(51) Int. Cl.[7] .............................................. H01L 27/00
(52) U.S. Cl. .................................. 250/208.1; 250/216
(58) Field of Search .......................... 250/208.1, 201.3, 250/201.9, 252.1, 458.1, 550, 216; 359/15, 9, 26, 299, 321, 561, 621, 622, 385; 382/210, 134

(56) References Cited

U.S. PATENT DOCUMENTS

| | | | |
|---|---|---|---|
| 4,750,022 A | | 6/1988 | Araki .......................... 355/46 |
| 5,051,770 A | | 9/1991 | Cornuejols ................... 354/432 |
| H1060 H | * | 5/1992 | Lazich ........................ 382/210 |
| 5,198,653 A | * | 3/1993 | Shen et al. ............... 250/201.9 |
| 5,204,770 A | * | 4/1993 | Kachru et al. .............. 359/299 |
| 5,291,008 A | * | 3/1994 | Havens et al. ......... 235/462.41 |
| 5,559,629 A | | 9/1996 | Sheets et al. ............... 359/364 |
| 5,973,844 A | * | 10/1999 | Burger ....................... 359/622 |
| 6,005,916 A | | 12/1999 | Johnson et al. ............... 378/87 |
| 6,008,945 A | | 12/1999 | Fergason .................... 359/630 |
| 6,078,390 A | * | 6/2000 | Bengtsson .................. 356/318 |
| 6,088,097 A | | 7/2000 | Uhl ............................ 356/318 |
| 6,124,974 A | | 9/2000 | Burger ....................... 359/621 |
| 6,128,068 A | | 10/2000 | Suzuki et al. ................. 355/53 |
| 6,195,213 B1 | | 2/2001 | Omura et al. ............... 359/727 |
| 6,248,988 B1 | * | 6/2001 | Krantz ...................... 250/201.3 |
| 6,344,893 B1 | * | 2/2002 | Mendlovic et al. ........ 356/3.14 |
| 6,448,556 B1 | * | 9/2002 | Cowley et al. .............. 250/311 |

OTHER PUBLICATIONS

Holst, Gerald C., "Image Quality: Does Your Detector Match Your Optics? Understanding the term "resolution" for both optics and detectors provides a solid basis for designing imaging systems." Photonics Spectra, Jan. 1999, pp. 144–146.

Casasesnt, David, "Performing Image Analysis With Optical Pattern Recognition," The Photonics Design and Applications Handbook, 1998, pp. 158–161.

Mukundakrishnan, Bharath, "Design for Visually Servoed Microassembly," Advanced Microsystems Laboratory, Department of Mechanical Engineering, University of Minnesota 2000.

"Using your microscope, high magnifications with an oil-immersion objective," http://www.fishdoc.co.uk/microscope/micro04.htm Jul. 9, 2001.

\* cited by examiner

Primary Examiner—Kevin Pyo
Assistant Examiner—Seung C. Sohn
(74) Attorney, Agent, or Firm—Amin & Turocy, LLP

(57) ABSTRACT

An imaging system and methodology is provided to facilitate optical imaging performance. The system includes a sensor having one or more receptors and an image transfer medium to scale the sensor and receptors to an object field of view. A computer, memory, and/or display associated with the sensor provides storage and/or display of information relating to output from the receptors to produce and/or process an image, wherein a plurality of illumination sources can also be utilized in conjunction with the image transfer medium. The image transfer medium can be configured as a k-space filter that correlates a pitch associated with the receptors to a diffraction-limited spot within the object field of view, wherein the pitch can be unit-mapped to about the size of the diffraction-limited spot within the object field of view.

35 Claims, 9 Drawing Sheets

IMAGING SYSTEM AND METHODOLOGY EMPLOYING RECIPROCAL SPACE OPTICAL DESIGN

TECHNICAL FIELD

The present invention relates generally to image and optical systems, and more particularly to a system and method to facilitate imaging performance via an image transfer medium that projects characteristics of a sensor to an object field of view.

BACKGROUND OF THE INVENTION

Optical technologies and sciences related to such fields as microscopy have evolved from ancient observations and understandings of the nature of light to the manner in which light can be manipulated via one or more optical devices such as through a lens. In fact, some sources have cited that Zacharias Jansen-of Holland in 1595, was possibly the first inventor of a multiple lens or compound microscope design. After Jansen, many improvements were incorporated into microscope designs over the centuries leading up to Lord Rayleigh's and Ernst Abbe's discoveries in the 19th century regarding diffraction limitations in lenses. These scientists demonstrated that physical laws of diffraction require that a minimum resolving distance of a lens is related to the wavelength of light divided by a parameter referred to as the Numeric Aperture of the lens. By the 1880's, oil immersion objective lenses were developed having a Numeric Aperture of about 1.4—leading the way for light microscopes to resolve between two small points at about the theoretical diffraction limits established by Rayleigh and Abbe. The resolution demonstrated by lenses operating at the limits of diffraction theory, however, is rarely achieved in practice without sacrificing other desirable characteristics. For instance, as light microscope designs continued to develop in the 20th century, increased magnification of smaller and smaller objects also continued, whereby many of the best microscope designs can offer visually "pleasing images" at about 1000 times magnification. Unfortunately, increased magnification in conventional microscope designs generally causes tradeoffs in other design features such as resolution and contrast.

In order to illustrate these tradeoffs, the following discussion provides a conventional microscope design methodology that has developed over the ages. Conventional microscope designs limit useful magnifications to approximately 1000 times (x) since the intrinsic spatial resolution of the lenses cannot exceed limits dictated by the well-known Rayleigh equation:

$$R = 1.22 \lambda / (NA_{OBJECT} + NA_{CONDENSER})$$

Thus, for a conventional 100×high resolution, "Infinity-Corrected", oil immersion objective lens, having a standard maximum Numerical Aperture of 1.25, utilized in conjunction with a regularly employed setting for the highest contrast of a sub-stage, in-air lighting condenser, having a Numerical Aperture of 0.9 employed in conjunction with oil immersion condensers having a Numerical Aperture of up to 1.4 (e.g., modern Kohler Lighting configurations), and applied at a standard illumination wavelength of 0.55 micron, for example, the resulting known best theoretical spatial resolution at the highest useful magnification is therefore about 0.312 microns (312 nanometers). Any increase in magnification increases image size but also results in well-known increased detail blur at the image plane. Consequently, typical best visual spatial resolution is based on contrast and magnification of so-called "pleasing images" and rarely actually exceeds 500 nanometers (0.5 microns) and is regularly on the order of 1000 nanometers (1 micron).

In modern times, optical designs have been applied to other technologies such as digital imaging, machine vision for direct imaging, inspection, fiducial and absolute measurement, counting, characterizing geometry, morphology, coordinate location, spectral information, analytical imaging for identification, medical clinical microscopic imaging, and a plurality of other image-based applications. In addition, video imaging techniques and associated computerized image processing methods have long been a standard inspection technique in many industries and applications. High resolution and high magnification video-based imaging systems have conventionally relied upon known techniques of conventional microscopic instrumentation coupled to a video camera or other device. Other variations have typically employed well-known "macro" and "tele-zoom" optical lens components, (long range and short range) coupled to video camera devices to achieve high magnification as well. Though many of the imaging applications mentioned above, employ these techniques regularly, the methods have been subject to optical and illumination related limitations that can cause substantial degradation of image quality and usefulness when high magnification and resolution are required.

Well-defined and known limitations of conventional high-magnification and/or high-resolution imaging systems include but are not limited to:

(1) Very narrow Field Of View (FOV) and very small Working Distance (WD) for high effective magnification;

(2) High Effective Magnification limited to "useful magnification" at accepted maximum of about 1000×and is determined by well-known optical diffraction effects which govern absolute possible spatial resolution in optical images;

(3) Very small Depth Of Field (DOF) typically less than 1 micron at high magnification; Inhomogeneous illumination sources (varying intensity across even a small field) are extremely position sensitive for correct magnification and contrast vs. spatial resolution for non-quantifiable "pleasing appearance" versus well known "empty resolution" in clinical and industrial microscopy;

(4) Objective lens to object distance decreases in operation from low to high power objective lenses in order to increase effective magnification (typical 15 to 20 mm for low power objective to fraction of a millimeter for up to 50×objectives;

(5) Highest Numerical Aperture is required for high magnification and is generally only achievable with immersion-type objective lenses; and (6) Very high Effective Magnification generally requires 50×to 100×objective lenses typical for object image projection to magnifying eyepiece or subsequent imaging device and have inherently short working distance and very small Field Of View as well as other limitations, including "empty magnification" problems.

Other problems with conventional imaging systems relate to oil immersion objective lenses to increase the numerical aperture through Index of Refraction matching fluid such as oil for objective magnification over 50×are typically (e.g., at 100×) required to achieve effective through-the-eyepiece magnifications of up to 1000×. This also requires extremely small objective lens to object spacing through the oil medium of approximately 100 microns or less. Other issues involve the small "circle of least confusion" (object plane image diameter) magnified by an inspection lens system (generally an optical eyepiece or equivalent) for projection onto an image sensor limiting spatial resolution to a number of sensor pixels across a projected image on to the sensor. This inherently limits both a Modulation Transfer Function that defines contrast versus resolution and absolute spatial resolution.

Still other problems can involve conventional "Infinity-corrected" microscope objectives that are designed with optical parameter correction for an effective "infinite-tube-length", thus these lenses can require a telescope objective lens (also called the "tube-lens") in addition to an eyepiece to bring the image into focus for the eye. Such systems are known to permit a convenient modular, or building-block concept of design since fairly sizeable accessories can be inserted into the infinity space without upsetting tube length, magnification, parfocality, working distance, or axial image quality. Though microscope systems employing infinity-corrected objective lens designs are widely available, these systems arc still designed via the conventional method of magnifying small objects in the field of view from the object plane through the "tube-lens" (telescope objective) to the eyepiece for viewing, or through a special magnifying lens to an imaging device (photographic or electronic). This is an accepted method of optical design employing geometrical optics design rules and results in even the most advanced conventional microscopic imaging systems having the aforementioned well-known limitations in projected Field Of View, Effective Magnification, Absolute Spatial Resolution, and Diffraction Limitations at the imaging device.

Generally, the design purpose of instruments employing conventional infinity-corrected microscope objectives is to permit the placement of certain auxiliary optical and illumination components in optical path length between the objective and image sensor. This region known as the "infinity space" is designed to introduce minimal aberrations and other unwanted optical effects. However, even the most advanced systems generally limit to two the number of such additional added components without specifying additional correcting optics.

Another problem with conventional high magnification image designs relates to special configurations to employ either transmissive or reflected illumination techniques. This can include special microscopic variations such as cardioid or paraboloid condensers, fluorescence and interference microscopy attachments, as well as typical machine vision illumination schemes (e.g., darkfield, brightfield, phase-contrast, and so forth), and conventional microscopic transmissive illumination techniques (Kohler, Abbe) that typically require vastly different optical imaging designs by nature and are generally mutually exclusive. These designs are also labor intensive for operational adjustment and for optimum image quality from sample to sample under examination. As can be appreciated, modern optical designs employing high-grade oil immersion lenses and/or other correcting optics generally involves significant expense.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to a system and methodology that facilitates imaging performance of optical imaging systems. In regard to several optical and/or imaging system parameters, many orders of performance enhancement can be realized over conventional systems (e.g., greater effective magnification, larger working distances, increased absolute spatial resolution, increased spatial field of view, increased depth of field, Modulation Transfer Function of about 1, oil immersion objectives and eye pieces not required). This is achieved by adapting an image transfer medium (e.g., one or more lenses, fiber optical media) to a sensor having one or more receptors (e.g., pixels) such that the receptors of the sensor are effectively scaled (e.g., "mapped", "sized", "projected", "matched", "reduced") to occupy an object field of view at about the scale or size associated with a diffraction limited point or spot within the object field of view. Thus, a band-pass filtering of spatial frequencies in what is known as Fourier space or "k-space" is achieved such that the projected size (projection in a direction from the sensor toward object space) of the receptor is filled in k-space.

In other words, the image transfer medium is adapted, configured and/or selected such that a transform into k-space is achieved, wherein an a priori design determination causes k-space or band-pass frequencies of interest to be substantially preserved throughout and frequencies above and below the k-space frequencies to be mitigated. It is noted that the frequencies above and below the k-space frequencies tend to cause blurring and contrast reduction and are generally associated with conventional optical system designs. This further illustrates that the systems and methods of the present invention are in contravention or opposition to conventional geometric paraxial ray designs. Consequently, many known optical design limitations associated with conventional systems are mitigated by the present invention.

According to one aspect of the present invention, a "k-space" design, system and methodology is provided which defines a "unit-mapping" of the Modulation Transfer Function (MTF) of an object plane to image plane relationship. The k-space design projects image plane pixels or receptors forward to the object plane to promote an optimum theoretical relationship. This is defined by a substantially one-to-one correspondence between image sensor receptors and projected object plane units (e.g., units defined by smallest resolvable points or spots in the object field of view) that are matched according to the receptor size. The k-Space design defines that "unit-mapping" or "unit-matching" acts as an effective "Intrinsic Spatial Filter" which implies that spectral components of both an object and an image in k-space (also referred to as "reciprocal-space") are substantially matched or quantized. Advantages provided by the k-space design result in a system and methodology capable of much higher Effective Magnification with much increased Field Of View, Depth Of Field, Absolute Spatial Resolution, and Working Distances utilizing dry objective lens imaging, for example, and without employing conventional oil immersion techniques.

The following description and the annexed drawings set forth in detail certain illustrative aspects of the invention. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

Figure 1:
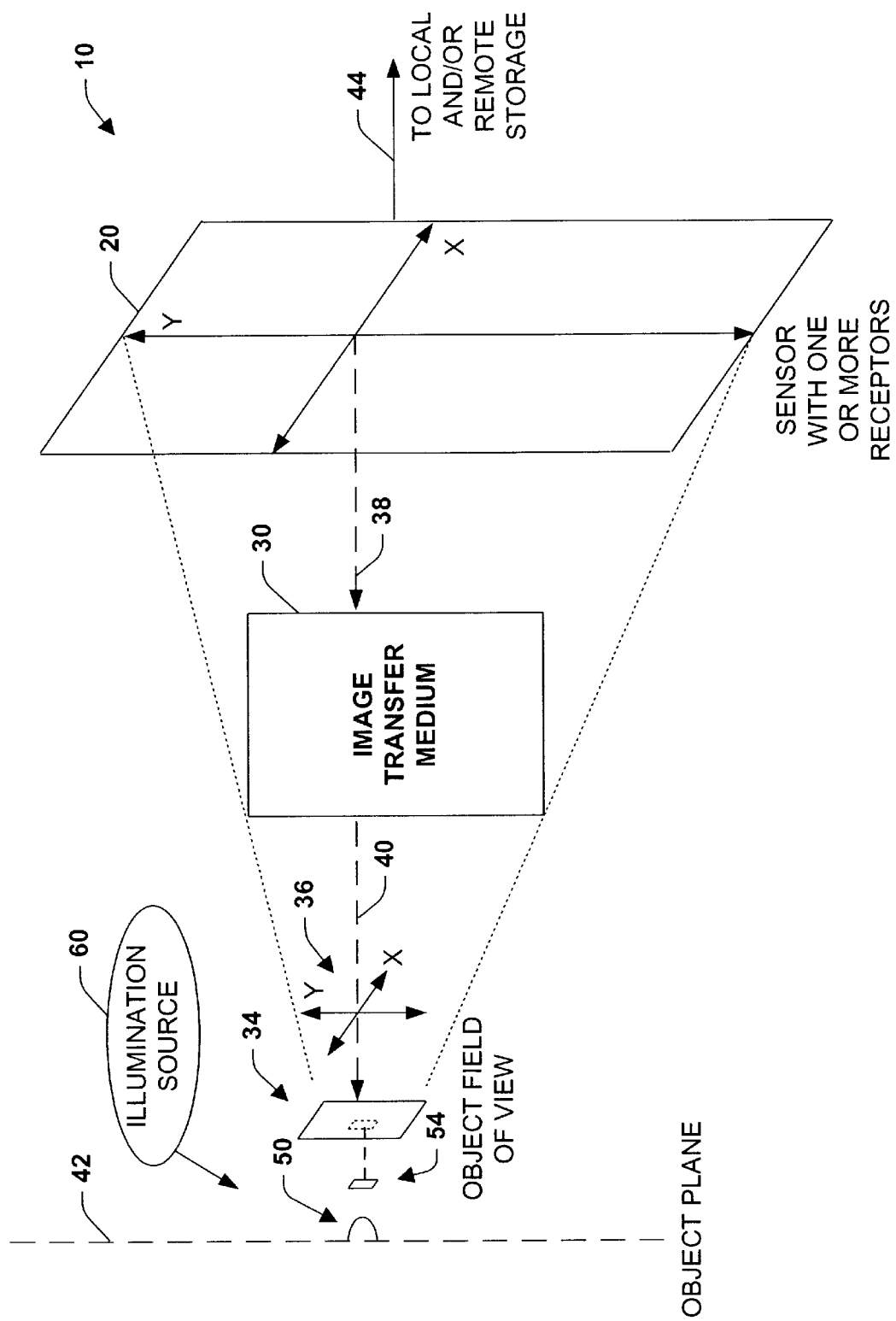
FIG. 1 is a schematic block diagram illustrating an imaging system in accordance with an aspect of the present invention.

The present invention relates to a system and methodology that greatly enhances a plurality of characteristics and/or parameters associated with microscopy and imaging in general. This enables technology for a plurality of applications utilizing a novel design approach which can include a general modular base-system to provide high effective magnification and high spatial resolution among other features. As an example, this can include vision-based microscopic imaging for a variety of applications while mitigating well-known disadvantages of conventional imaging designs and practices. Applications for the present invention can employ image and optical measurement of various samples, objects, materials, and/or matter and also provide for various microscopic imaging and measurement situations such as material, sample handling, inspection and analysis, for example.

According to one aspect of the present invention, a k-space filter is provided that can be configured from an image transfer medium such as optical media that correlates image sensor receptors to an object field of view. A variety of illumination sources can also be employed to achieve one or more operational goals and for versatility of application. The k-space design of the present invention promotes capture and analysis (e.g., automated and/or manual) of images having a high Field Of View (FOV) at substantially high Effective Magnification as compared to conventional systems. This can include employing a small Numerical Aperture (NA) associated with lower magnification objective lenses to achieve very high Effective Magnification. As a consequence, images having a substantially large Depth Of Field (DOF) at very high Effective Magnification are also realized. The k-space design also facilitates employment of homogeneous illumination sources that are substantially insensitive to changes in position.

According to another aspect of the present invention, an objective lens to object distance (e.g., Working Distance) can be maintained in operation at low and high power effective magnification imaging, wherein typical spacing can be achieved at about 0.5 mm or more and about 20 mm or less, as opposed to conventional microscopic systems which can require significantly smaller (as small as 0.01 mm) object to objective lens distances for comparable (e.g., similar order of magnitude) Effective Magnification values. It is to be appreciated that the present invention is not limited to operating at the above working distances. In many instances the above working distances are employed, however, in some instances, smaller or larger distances are employed. It is further noted that oil immersion or other Index of Refraction matching media or fluids for objective lenses are generally not required (e.g., substantially no improvement to be gained) at one or more effective image magnification levels of the present invention yet, still exceeding effective magnification levels achievable in conventional microscopic optical design variations including systems employing "infinity-corrected" objective lenses.

The k-space design of the present invention defines that a small "Blur Circle" or diffraction limited point/spot at the object plane is determined by parameters of the design to match image sensor receptors or pixels with a substantially one-to-one correspondence by "unit-mapping" of object and image spaces for associated object and image fields. This enables the improved performance and capabilities of the present invention. One possible theory of the k-space design results from the mathematical concept that since the Fourier Transform of both an object and an image is formed in k-space (also called "reciprocal space"), the sensor should be mapped to the object plane in k-space via optical design techniques and component placement in accordance with the present invention. It is to be appreciated that a plurality of other transforms or models can be utilized to configure and/or select one or more components in accordance with the present invention. For example, wavelet transforms, LaPlace (s-transforms), z-transforms as well as other transforms can be similarly employed.

The k-space design methodology is unlike conventional optical systems designed according to geometric, paraxial ray-trace and optimization theory, since the k-space optimization facilitates that the spectral components of the object and the image are the same in k-space, and thus quantized. Therefore, there are substantially no inherent limitations imposed on a Modulation Transfer Function (MTF) describing contrast versus resolution and. absolute spatial resolution in the present invention. Quantization, for example, in k-space yields a substantially unitary Modulation Transfer Function not realized by conventional systems. It is noted that high MTF, Spatial Resolution, and effective image magnification can be achieved with much lower magnification objective lenses with desirable lower Numerical Apertures (e.g., generally<50×) through "unit-mapping" of projected pixels in an "Intrinsic Spatial Filter" provided by the k-space design.

If desired, "infinity-corrected" objectives can be employed with associated optical component and illumination, as well as spectrum varying components, polarization varying components, and/or contrast or phase varying components. These components can be included in an optical path-length between an objective and the image within an "infinity space". Optical system accessories and variations can thus be positioned as interchangeable modules in this geometry. The k-space design, in contrast to conventional microscopic imagers that utilize "infinity-corrected" objectives, enables the maximum optimization of the infinity space geometry by the "unit-mapping" concept.

This implies that there is generally no specific limit to the number of additional components that can be inserted in the "infinity space" geometry as in conventional microscopic systems that typically specify no more than 2 additional components without optical correction.

The present invention also enables a "base-module" design that can be configured and reconfigured in operation for a plurality of different applications if necessary to employ either transmissive or reflected illumination, if desired. This includes substantially all typical machine vision illumination schemes (e.g., darkfield, brightfield, phase-contrast), and other microscopic transmissive techniques (Kohler, Abbe), in substantially any offset and can include Epi illumination. The systems of the present invention can be employed in a plurality of opto-mechanical designs that are robust since the k-space design is substantially not sensitive to environmental and mechanical vibration and thus generally does not require heavy structural mechanical design and isolation from vibration associated with conventional microscopic imaging instruments. Other features can include digital image processing, if desired, along with storage (e.g., local database, image data transmissions to remote computers for storage/analysis) and display of the images produced in accordance with the present invention (e.g., computer display, printer, film, and other output media). Remote signal processing of image data can be provided, along with communication and display of the image data via associated data packets that are communicated over a network or other medium, for example.

Referring initially to FIG. 1, an imaging system 10 is illustrated in accordance with an aspect of the present invention. The imaging system 10 includes a sensor 20 having one or more receptors such as pixels or discrete light detectors (See e.g., illustrated below in FIG. 3) operably associated with an image transfer medium 30. The image transfer medium 30 is adapted or configured to scale the proportions of the sensor 20 at an image plane established by the position of the sensor 20 to an object field of view illustrated at reference numeral 34. A planar reference 36 of X and Y coordinates is provided to illustrate the scaling or reduction of the apparent or virtual size of the sensor 20 to the object field of view 34. Direction arrows 38 and 40 illustrate the direction of reduction of the apparent size of the sensor 20 toward the object field of view 34.

The object field of view 34 established by the image transfer medium 30 is related to the position of an object plane 42 that includes one or more items under microscopic examination (not shown). It is noted that the sensor 20 can be substantially any size, shape and/or technology (e.g., digital sensor, analog sensor, Charge Coupled Device (CCD) sensor, CMOS sensor, Charge Injection Device (CID) sensor, an array sensor, a linear scan sensor) including one or more receptors of various sizes and shapes, the one or more receptors being similarly sized or proportioned on a respective sensor to be responsive to light (e.g., visible, non-visible) received from the items under examination in the object field of view 34. As light is received from the object field of view 34, the sensor 20 provides an output 44 that can be directed to a local or remote storage such as a memory (not shown) and displayed from the memory via a computer and associated display, for example, without substantially any intervening digital processing (e.g., straight bit map from sensor memory to display), if desired. It is noted that local or remote signal processing of the image data received from the sensor 20 can also occur. For example, the output 44 can be converted to electronic data packets and transmitted to a remote system over a network for further analysis and/or display. Similarly, the output 44 can be stored in a local computer memory before being transmitted to a subsequent computing system for further analysis and/or display.

The scaling provided by the image transfer medium 30 is determined by a novel k-space configuration or design within the medium that promotes predetermined k-space frequencies of interest and mitigates frequencies outside the predetermined frequencies. This has the effect of a band-pass filter of the spatial frequencies within the image transfer medium 30 and notably defines the imaging system 10 in terms of resolution rather than magnification. As will be described in more detail below, the resolution of the imaging system 10 determined by the k-space design promotes a plurality of features in a displayed or stored image such as having high effective magnification, high spatial resolution, large depth of field, larger working distances, and a unitary Modulation Transfer Function as well as other features.

In order to determine the k-space frequencies, a "pitch" or spacing is determined between adjacent receptors on the sensor 20, the pitch related to the center-to-center distance of adjacent receptors and about the size or diameter of a single receptor. The pitch of the sensor 20 defines the Nyquist "cut-off" frequency band of the sensor. It is this frequency band that is promoted by the k-space design, whereas other frequencies are mitigated. In order to illustrate how scaling is determined in the imaging system 10, a small or diffraction limited spot or point 50 is illustrated at the object plane 42. The diffraction limited point 50 represents the smallest resolvable object determined by optical characteristics within the image transfer medium 30 and is described in more detail below. A scaled receptor 54, depicted in front of the field of view 34 for exemplary purposes, and having a size determined according to the pitch of the sensor 20, is matched or scaled to be about the same size in the object field of view 34 as the diffraction limited point 50.

In other words, the size of any given receptor at the sensor 20 is effectively reduced in size via the image transfer medium 30 to be about the same size (or matched in size) to the size of the diffraction limited point 50. This also has the effect of filling the object field of view 34 with substantially all of the receptors of the sensor 20, the respective receptors being suitably scaled to be similar in size to the diffraction limited point 50. As will be described in more detail below, the matching/mapping of sensor characteristics to the smallest resolvable object or point within the object field of view 34 defines the imaging system 10 in terms of absolute spatial resolution and profoundly enhances the operating performance of the system.

An illumination source 60 can be provided with the present invention in order that photons can be emitted from objects in the field of view 34 to enable activation of the receptors in the sensor 20. It is noted that the present invention can potentially be employed without an illumination source 60 if potential self-luminous objects (e.g., biological specimens such as a firefly) emit enough radiation to activate the sensor 60. It has been observed that Light Emitting Diodes provide an effective illumination source 60 in accordance with the present invention. Substantially any illumination source 60 can be applied including coherent and non-coherent sources, visible and non-visible wavelengths. However, for non-visible wavelength sources, the sensor 20 would also be suitably adapted. For example, for an infrared or ultraviolet source, an infrared or ultraviolet sensor 20 would be employed, respectively. Other illumination sources 60 can include wavelength-specific lighting, broad-band lighting, continuous lighting, strobed lighting, Kohler illumination, Abbe illumination, phase-contrast illumination, darkfield illumination, brightfield illumination, and Epi illumination. Transmissive or reflective lighting techniques can also be applied.

Figure 2:
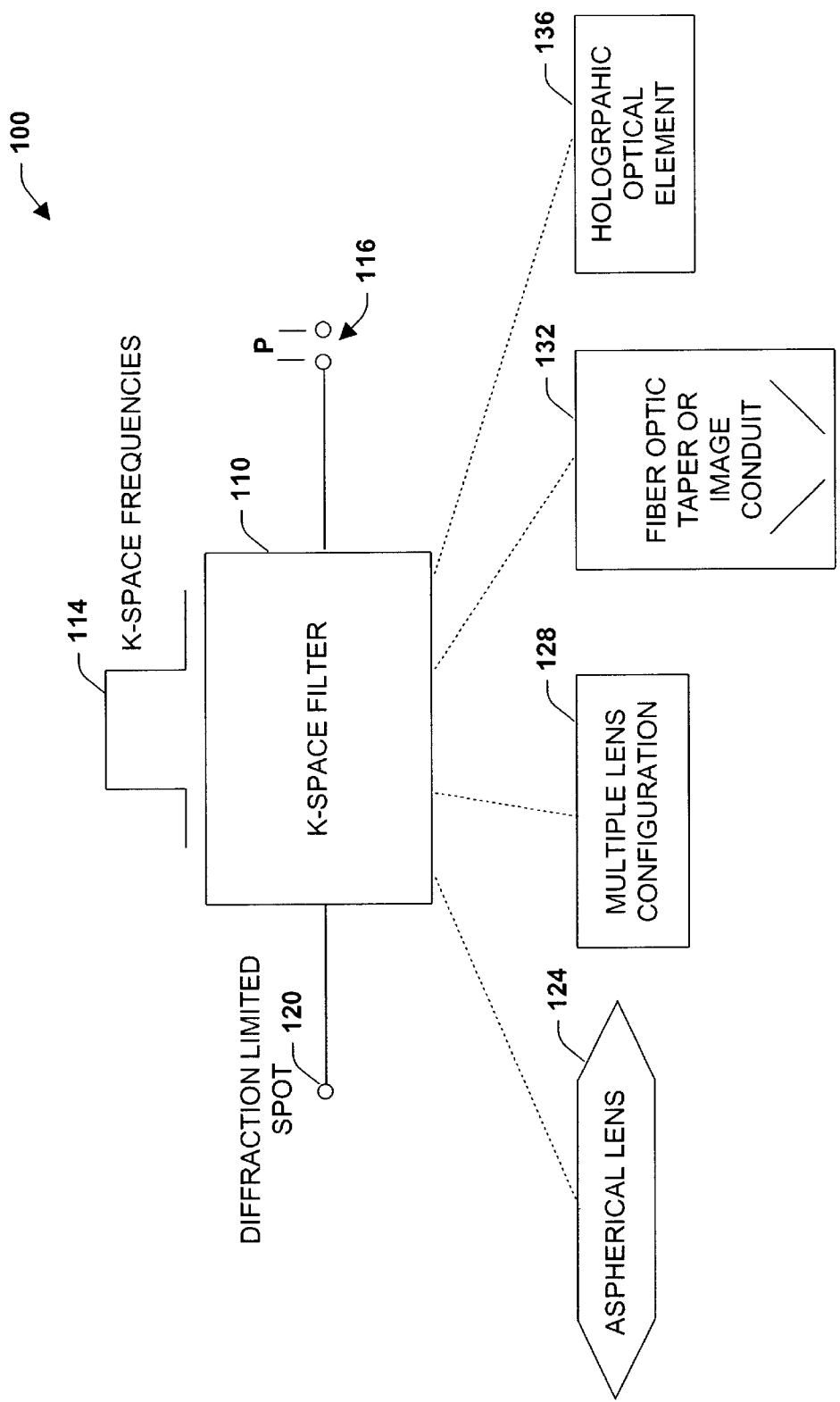
FIG. 2 is a diagram illustrating a k-space system design in accordance with an aspect of the present invention.

Referring now to FIG. 2, a system 100 illustrates an image transfer medium 30 in accordance with an aspect of the present invention. The image transfer medium 30 depicted in FIG. 1 can be provided according to the k-space design concepts described above and more particularly via a k-space filter 110 adapted, configured and/or selected to promote a band of predetermined k-space frequencies 114 and to mitigate frequencies outside of this band. This is achieved by determining a pitch "P"—which is the distance between adjacent receptors 116 in a sensor (not shown) and sizing optical media within the filter 110 such that the pitch "P" of the receptors 116 is matched in size with a diffraction-limited spot 120. The diffraction-limited spot 120 can be determined from the optical characteristics of the media in the filter 110. For example, the Numerical Aperture of an optical medium such as a lens defines the smallest object or spot that can be resolved by the lens. The filter 110 performs a k-space transformation such that the size of the pitch is effectively matched, "unit-mapped", projected, correlated, and/or reduced to the size or scale of the diffraction limited spot 120.

It is to be appreciated that a plurality of novel optical configurations can be provided to achieve the k-space filter 110. One such configuration can be provided by an aspherical lens 124 adapted such to perform the k-space transformation and reduction from sensor space to object space. Yet another configuration can be provided by a multiple lens arrangement 128, wherein the lens combination is selected to provide the filtering and scaling. Still yet another configuration can employ a fiber optic taper 132 or image conduit, wherein multiple optical fibers or array of fibers are configured in a funnel-shape to perform the mapping of the sensor to the object field of view. It is noted that the fiber optic taper 132 is generally in physical contact between the sensor and the object under examination (e.g., contact with microscope slide). Another possible k-space filter 110 arrangement employs a holographic optical element 136, wherein a substantially flat optical surface is configured via a hologram (e.g., computer-generated, optically generated, and/or other method) to provide the mapping in accordance with the present invention.

The k-space optical design as enabled by the k-space filter 110 is based upon the "effective projected pixel-pitch" of the sensor, which is a figure derived from following ("projecting") the physical size of the sensor array elements back through the optical system to the object plane. In this manner, conjugate planes and optical transform spaces are matched to the Nyquist cut-off of the effective receptor or pixel size. This maximizes the effective image magnification and the Field Of View as well as the Depth Of Field and the Absolute Spatial Resolution. Thus, a novel application of optical theory is provided that does not rely on conventional geometric optical design parameters of paraxial ray-tracing which govern conventional optics and imaging combinations. This can further be described in the following manner.

A Fourier transform of an object and an image is formed (by an optical system) in k-space (also referred to as "reciprocal-space"). It is this transform that is operated on for image optimization by the k-space design of the present invention. For example, the optical media employed in the present invention can be designed with standard, relatively non-expensive "off-the-shelf" components having a configuration which defines that the object and image space are "unit-mapped" or "unit-matched" for substantially all image and object fields. A small Blur-circle or diffraction-limited spot 120 at the object plane is defined by the design to match the pixels in the image plane (e.g., at the image sensor of choice) with substantially one-to-one correspondence and thus the Fourier transforms of pixelated arrays can be matched. This implies that, optically by design, the Blur-circle is scaled to be about the same size as the receptor or pixel pitch. The present invention is defined such that it constructs an Intrinsic Spatial Filter such as the k-space filter 110. Such a design definition and implementation enables the spectral components of both the object and the image in k-space to be about the same or quantized. This also defines that the Modulation Transfer Function (MTF) (the comparison of contrast to spatial resolution) of the sensor is matched to the MTF of the object Plane.

Figure 3:
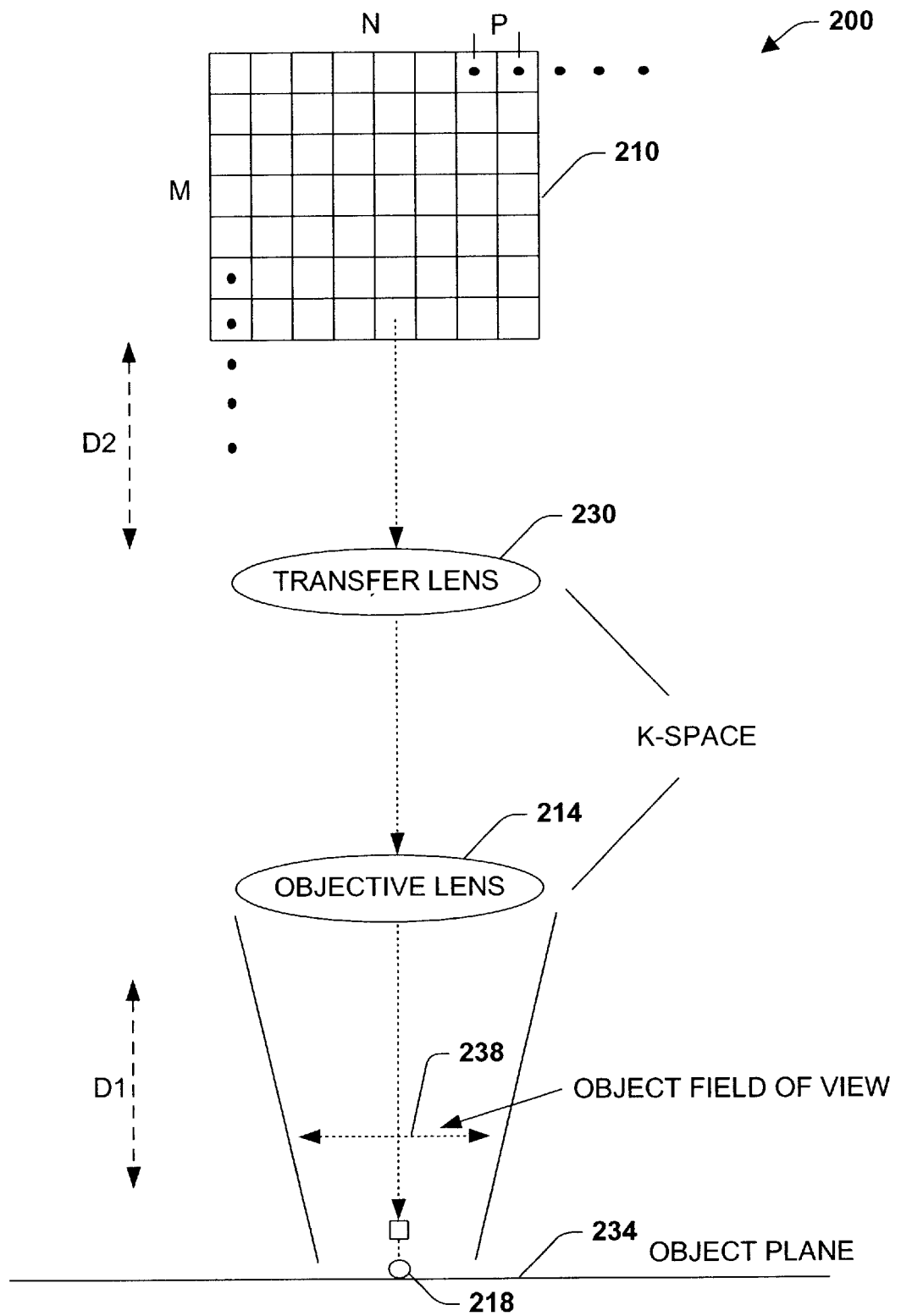
FIG. 3 is a diagram of an exemplary system illustrating sensor receptor matching in accordance with an aspect of the present invention.

Turning now to FIG. 3, a multiple lens system 200 illustrates an exemplary unit-mapping design in accordance with an aspect of the present invention. The system 200 includes an M by N array 210 of sensor pixels (e.g., 1024×1280), having M rows and N columns, M and N being integers respectively. Although a rectangular array 210 having square pixels is depicted, it is to be appreciated as noted above, the array 210 can be substantially any shape such as circular, wherein respective pixels within the array 210 can also be substantially any shape or size, the pixels in any given array 210 being similarly sized and spaced. Unit-mapping can be determined for a plurality of sensors and lens combinations. For example, a substantially-wide diameter achromatic objective lens 214 (e.g., about 10 millimeters to about 100 millimeters in diameter) can be selected to preserve k-space frequencies of interest and having a Numerical Aperture capable of resolving diffraction-limited spots 218 of about 1.0 microns, for example, and having a focal length "D1" of about 1.0 centimeters. It is noted that the dimensions selected for the system 200 are provided for exemplary purposes to facilitate understanding of the concepts described above. Thus, for example, if an objective lens 214 were selected that is capable of resolving diffraction limited spots 218 having other dimensions (e.g., 0.2, 0.3, 0.4, 0.6 microns), then a different lens, sensor and/or lens/sensor combination would be selected to provide the scaling and/or unit-mapping in accordance with the present invention.

In order to provide unit-mapping according to this example, and assuming for purposes of illustration that the sensor array 210 provides a pixel pitch "P" of about 10.0 microns, a relationship is to be determined between an achromatic transfer lens 230 and the objective lens 214 such that a reduction is achieved from sensor space defined at the array 210 to object space defined at an object plane 234 and thus, scaling respective pixels from the array 210 to about the size of the diffraction limited spot 218. It is noted that substantially all of the pixels are projected into an object field of view depicted at reference numeral 238 and defined by the objective lens 214, wherein respective pixels are sized to about the dimensions of the diffraction limited spot 218. The reduction in size of the array 210 and associated pixels can be achieved by selecting the transfer lens to have a focal length "D2" (from the array 210 to the transfer lens 230) of about 10.0 centimeters in this example. In this manner, the pixels in the array 210 are effectively reduced in size to about 1.0 micron per pixel, thus matching the size of the diffraction limited spot 218 and filling the object field of view 238 with a "virtually-reduced" array of pixels 210.

As illustrated in FIG. 3, k-space is defined as the region between the objective lens 214 and the transfer lens 230. It is to be appreciated that substantially any optical media, lens type and/or lens combination that reduces, maps and/or projects the sensor array 210 to the object field of view 238 in accordance with unit or k-space mapping as has been previously described is within the scope of the present invention. To illustrate the novelty of the exemplary lens/sensor combination depicted in FIG. 3, it is noted that conventional objective lenses, sized according to conventional geometric paraxial ray techniques, are generally sized according to the magnification, Numeric Aperture, focal length and other parameters provided by the objective. Thus, the objective lens would be sized with a greater focal length than subsequent lenses that approach or are closer to the sensor (or eyepiece in conventional microscope) in order to provide magnification of small objects. This can result in magnification of the small objects at the object plane being projected as a magnified image of the objects across "portions" of the sensor and results in known detail blur (e.g., Rayleigh diffraction and other limitations in the optics), empty magnification problems, and Nyquist aliasing among other problems at the sensor. The k-space design of the present invention operates in contravention to geometric paraxial ray design principles. As illustrated in FIG. 3, the objective lens 214 and the transfer lens 230 operate to provide a reduction in size of the sensor array 210 to the object field of view 238 as demonstrated by the relationship of the lenses.

Figure 4:
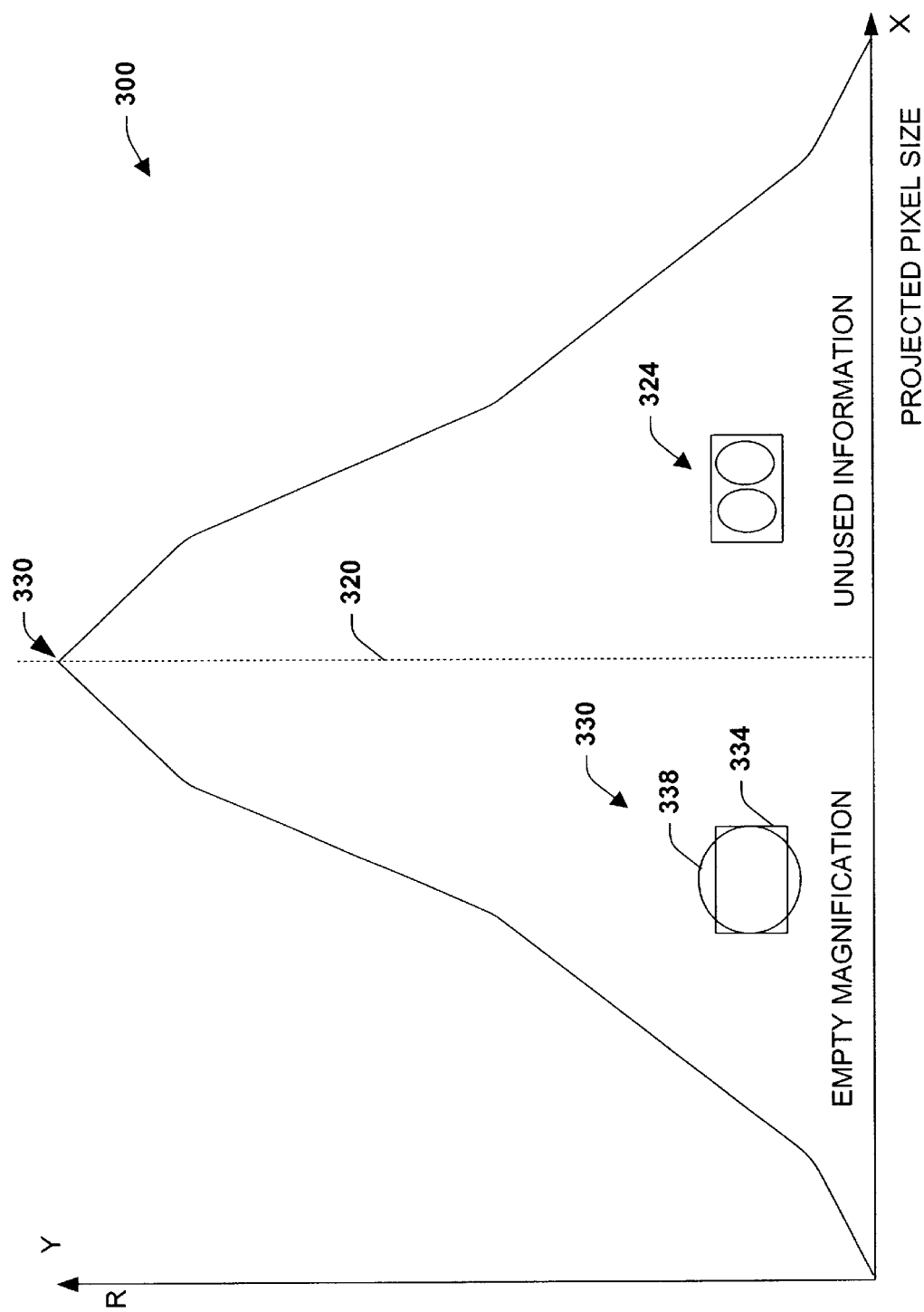
FIG. 4 is a graph illustrating sensor matching considerations in accordance with an aspect of the present invention.

Referring now to FIG. 4, a graph 300 illustrates mapping characteristics and comparison between projected pixel size on the X axis and diffraction-limited spot resolution size "R" on the Y axis. At the apex 310 of the graph 300, a unit mapping between projected pixel size and diffraction-limited spot size occurs which is the optimum relationship in accordance with the present invention. It is noted that the objective lens 214 depicted in FIG. 3 should generally not be selected-such that the diffraction-limited size "R" of the smallest resolvable objects arc smaller than a projected pixel size. If so, "economic waste" can occur wherein more precise information is lost (e.g., selecting an object lens more expensive than required). This is illustrated to the light of a dividing line 320 at reference 324 depicting a projected pixel larger that two smaller diffraction spots. If an objective is selected with diffraction-limited performance larger than the projected pixel size, blurring and empty magnification can occur. This is illustrated to the left of line 320 at reference numeral 330, wherein a projected pixel 334 is smaller than a diffraction-limited object 338. It is to be appreciated, however, that even if substantially one-to-one correspondence is not achieved between projected pixel size and the diffraction-limited spot, a system can be configured with less than optimum matching (e.g. 0.1%, 1%, 2%, 5%, 20%, 95% down from the apex 310 on the graph 300 to the left or right of the line 320) and still provide suitable performance. Thus, less than optimal matching is intended to fall within the spirit and the scope of present invention. It is further noted that the diameter of the lenses in the system as illustrated in FIG. 3, for example, should be sized such that when a Fourier Transform is performed from object space to sensor space, spatial frequencies of interest that are in the band pass region described above (e.g., frequencies utilized to define the size and shape of a pixel) are substantially not attenuated. This generally implies that larger diameter lenses (e.g., about 10 to 100 millimeters) should be selected to mitigate attenuation of the spatial frequencies of interest.

Figure 5:
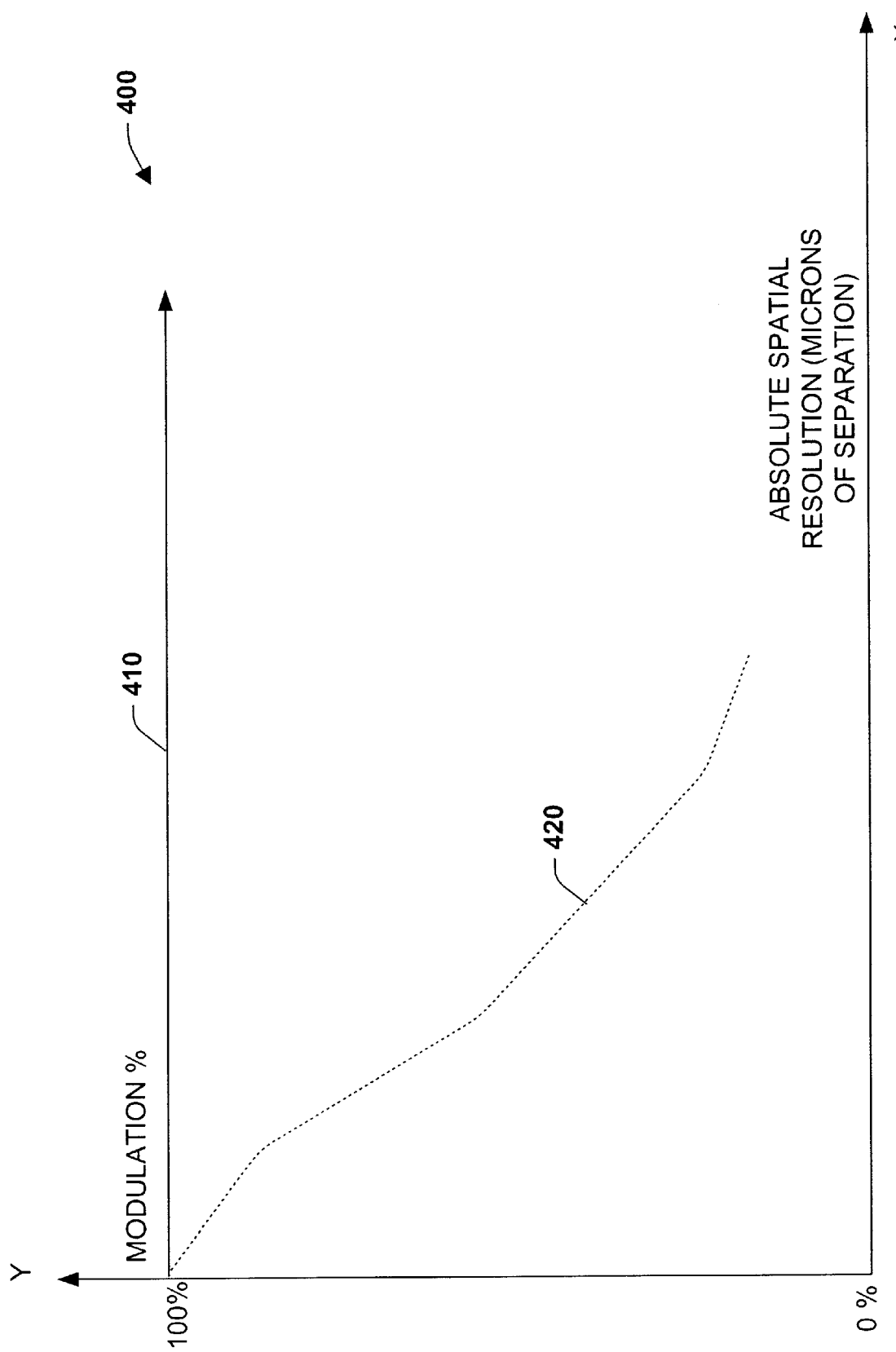
FIG. 5 is a graph illustrating a Modulation Transfer Function in accordance with an aspect of the present invention.

Referring now to FIG. 5, a Modulation Transfer function 400 is illustrated in accordance with the present invention. On a Y-axis, modulation percentage from 0 to 100% is illustrated defining percentage of contrast between black and white. On an X-axis, Absolution Spatial Resolution is illustrated in terms of microns of separation. A line 410 illustrates that modulation percentage remains substantially constant at about 100% over varying degrees of spatial resolution. Thus, the Modulation Transfer Function is about 1 for the present invention up to about a limit imposed by the signal to noise sensitivity of the sensor. For illustrative purposes, a conventional optics design Modulation Transfer Function is illustrated by line 420 which may be an exponential curve and generally decreases at about a 45 degree angle.

Figure 6:
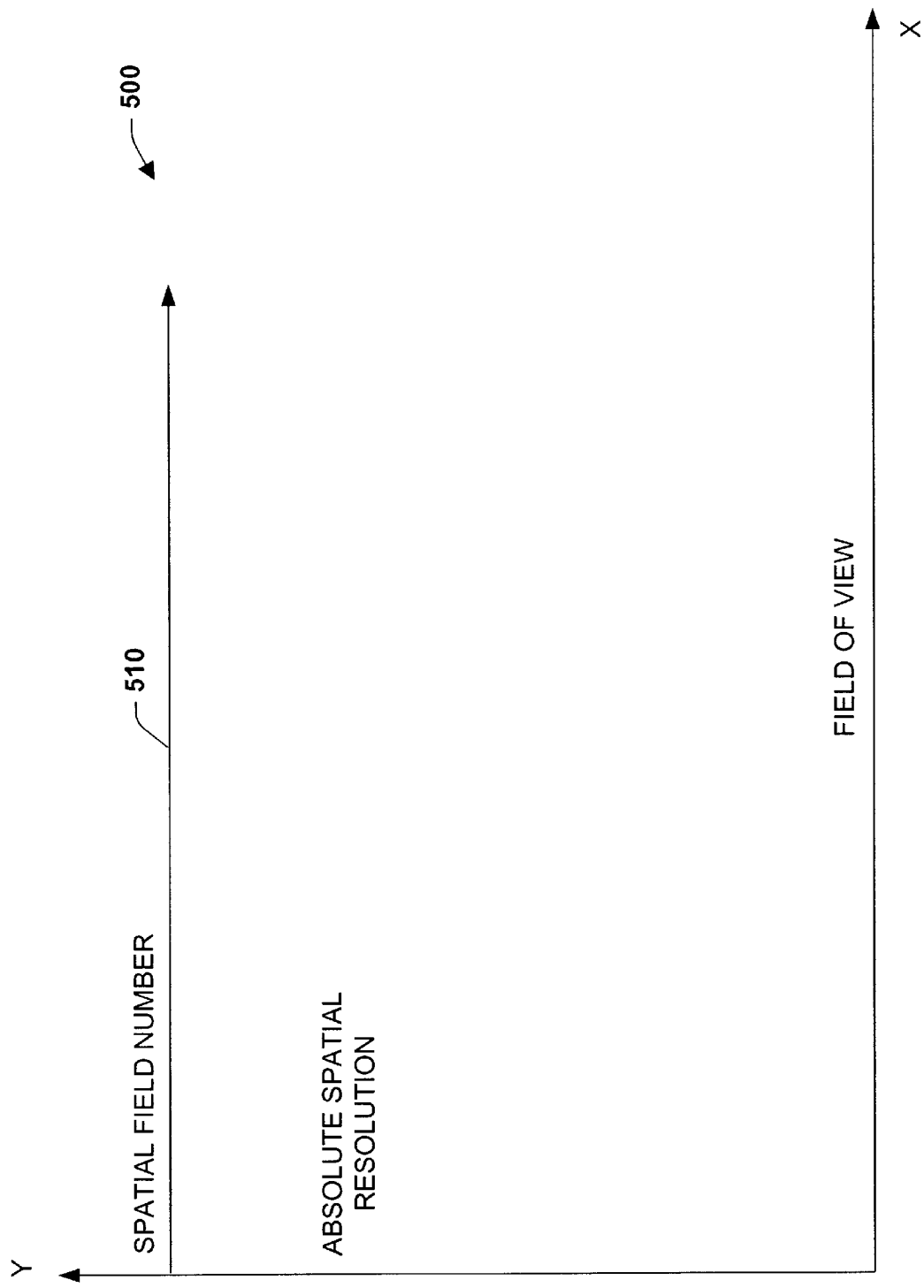
FIG. 6 is a graph illustrating a figure of merit relating to a Spatial Field Number in accordance with an aspect of the present invention.

FIG. 6 illustrates a quantifiable Figure of Merit (FOM) for the present invention defined as dependent on two primary factors: Absolute Spatial Resolution ($R_A$, in microns), depicted on the Y axis and the Field Of View (F, in microns) depicted on the X axis. A reasonable FOM called "Spatial Field Number" (S), can be expressed as the ratio of these two previous quantities, with higher values of S being desirable for imaging as follows:

$$S=F/R_A$$

A line 510 illustrates that the FOM remains substantially constant across the field of view and over different values of absolute spatial resolution which is a significant enhancement over conventional systems.

Figure 7:
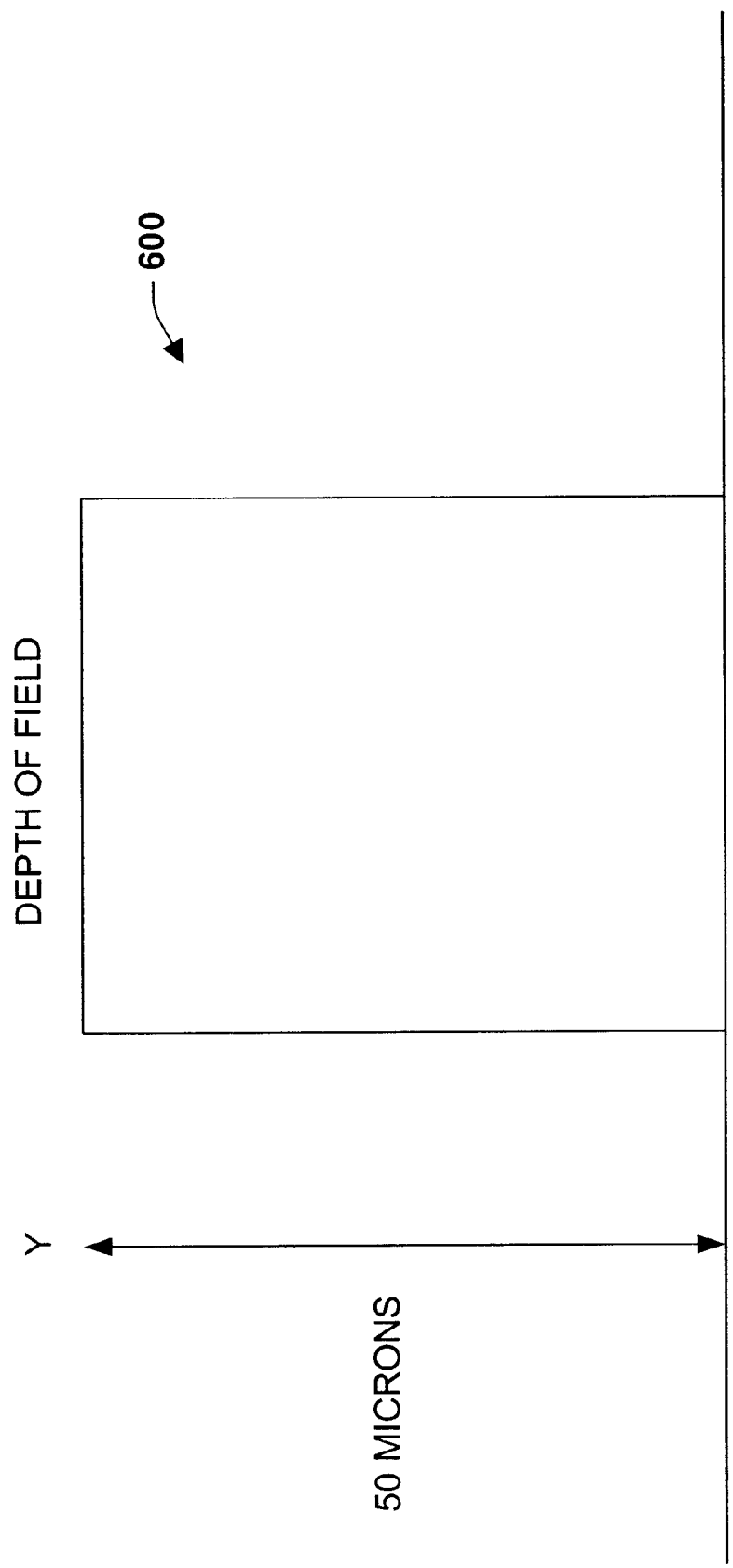
FIG. 7 is a diagram illustrating Depth of Field in accordance with an aspect of the present invention.

Referring to FIG. 7, a cube 600 illustrates a depth of field measurement in accordance with the present invention. Since the present invention is defined in terms of resolution and can be designed with lower power objectives in general, the depth of field for an image is greatly enhanced and defined as the distance along the Y axis looking into the image, yet still remaining in focus. The present invention can provide a depth of field of about 50 microns and still remain in focus for a plurality of objects and shapes that are within an image depth in relation to other respective objects of about 50 microns. This parameter is enhanced from about 50 to 100 times over conventional system capabilities for comparable or equivalent Effective Magnifications.

Figure 8:
FIG. 8 is a chart illustrating exemplary performance specifications in accordance with an aspect of the present invention.

FIG. 8 illustrates a chart 700 of exemplary and typical performance parameters that can be achieved via the k-space design of the present invention employing standard, low-cost, and commercially available components such as dry objective lenses, a 1024×1280 sensor, LED illumination source wavelengths selected at about twice the wavelength of the desired resolution (e.g., for 200 nanometer resolution, 400 nanometer light source selected), and a straight bit map from sensor to image display without intervening signal processing. As can be observed, effective magnifications of to about 5000 times can be achieved at a resolution of about 200 nanometer in a typical non-optimized system. As used herein, the term "Effective Magnification" is utilized to objectively compare the relative apparent image size and Absolute Spatial Resolution of the present invention with conventional microscopic imaging systems.

Figure 9:
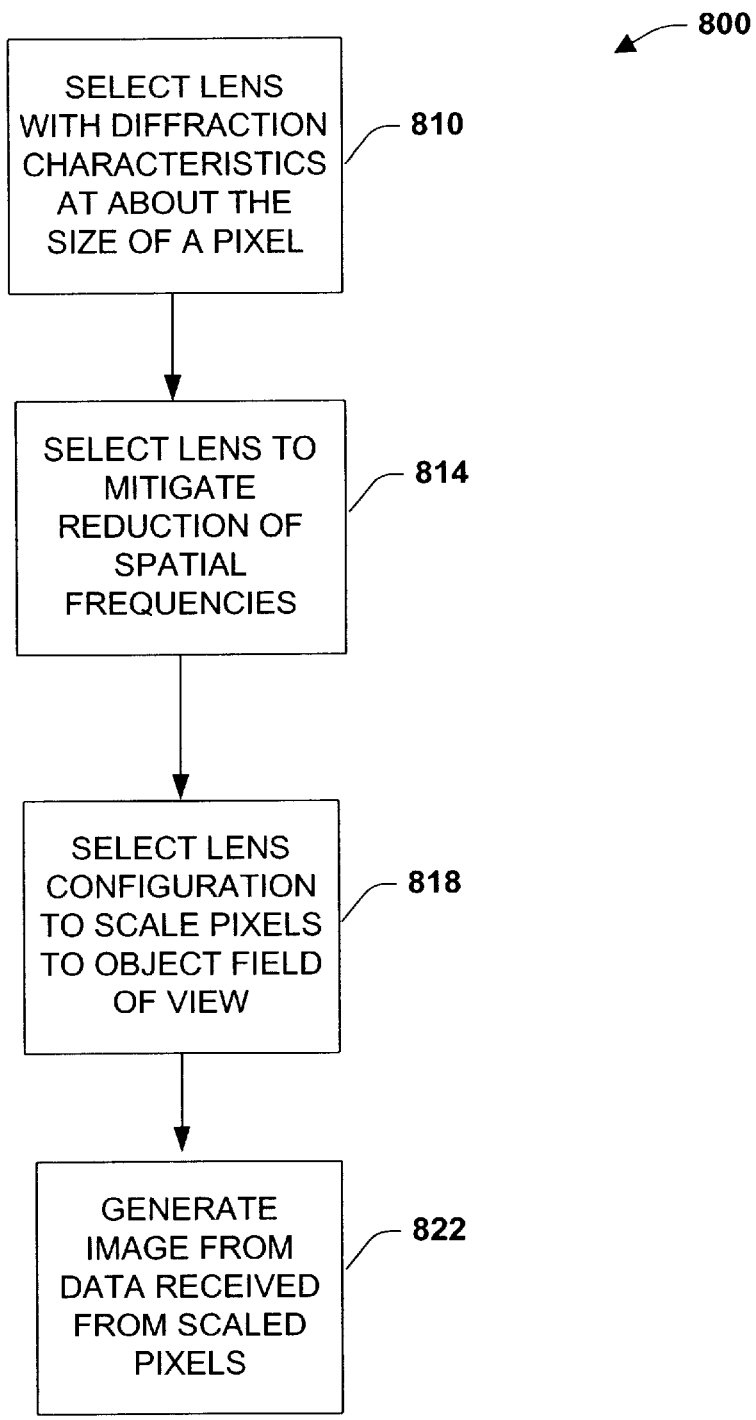
FIG. 9 is a flow diagram illustrating an imaging methodology in accordance with an aspect of the present invention.

FIG. 9 illustrates a methodology 800 to facilitate imaging performance in accordance with the present invention. While, for purposes of simplicity of explanation, the methodology is shown and described as a series of acts, it is to be understood and appreciated that the present invention is not limited by the order of acts, as some acts may, in accordance with the present invention, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention.

Proceeding to 810, lenses are selected having diffraction-limited characteristics at about the same size of a pixel in order to provide unit-mapping and optimization of the k-space design. At 814, lens characteristics are also selected to mitigate reduction of spatial frequencies within k-space. As described above, this generally implies that larger diameter optics are selected in order to mitigate attenuation of desired k-space frequencies of interest. At 818, a lens configuration is selected such that pixels, having a pitch "P", at the image plane defined by the position of a sensor are scaled according to the pitch to an object field of view at about the size of a diffraction-limited spot (e.g., unit-mapped) within the object field of view. At 822, an image is generated by outputting data from a sensor and storing the data in memory for direct display to a computer display and/or subsequent local or remote image processing and/or analysis within the memory.

In accordance with the concepts described above in relation to FIGS. 1–9, a plurality of related imaging applications can be enabled and enhanced by the present invention. For example, these applications can include but are not limited to imaging, control, inspection, microscopy and/or other analysis such as:

(1) Bio-medical analysis (e.g., cell colony counting, histology, frozen sections, cellular cytology, Haematology, pathology, oncology, fluorescence, interference, phase and many other clinical microscopy applications);

(2) Particle Sizing Applications (e.g., Pharmaceutical manufacturers, paint manufacturers, cosmetics manufacturers, food process engineering, and others);

(3) Air quality monitoring and airborne particulate measurement (e.g., clean room certification, environmental certification, and so forth);

(4) Optical defect analysis, and other requirements for high resolution microscopic inspection of both transmissive and opaque materials (as in metallurgy, semiconductor inspection and analysis, vision systems and so forth); and (5) Imaging technologies such as cameras, copiers, FAX machines and medical systems.

What has been described above are preferred aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An imaging system, comprising:
    a sensor having one or more receptors, the receptors having a receptor size parameter; and
    an image transfer medium having a resolution parameter that is correlated with the receptor size parameter, the image transfer medium comprising a multiple lens configuration, the multiple lens configuration further comprising a first lens positioned toward the object field of view and a second lens positioned toward the sensor, the first lens sized to have a focal length smaller than the second lens to provide an apparent reduction of the one or more receptors within the image transfer medium.

2. The system of claim 1, the image transfer medium providing a k-space filter that correlates a pitch associated with the one or more receptors to a diffraction-limited spot within the image transfer medium.

3. The system of claim 2, the pitch being unit-mapped to about the size of the diffraction-limited spot within the image transfer medium.

4. The system of claim 1, the image transfer medium further comprising at least one of an aspherical lens, a fiber optic taper, an image conduit, and a holographic optic element.

5. The system of claim 1, the sensor comprising at least one of a Charge Coupled Device (CCD) sensor, a CMOS sensor, and a Charge Injection Device (CID) sensor.

6. The system of claim 1, the sensor being substantially any size and shape, the one or more receptors being substantially any size and shape, the one or more receptors being similarly sized and shaped per a given sensor.

7. The system of claim 6, the sensor further comprising an M by N array of pixels associated with the one Or more receptors, M and N representing integer rows and columns respectively.

8. The system of claim 1, the sensor further comprising at least one of digital sensor, analog sensor, Charge Coupled Device (CCD) sensor, CMOS sensor, Charge Injection Device (CID) sensor; an array sensor, and a linear scan sensor.

9. The system of claim 1, the image transfer medium enabling a working distance from an object plane to the image transfer medium of about 0.5 millimeters or more and about 20 millimeters or less.

10. The system of claim 1, further comprising an illumination source to illuminate one or more non-luminous objects within the object field of view.

11. The system of claim 10, the illumination source further comprises a Light Emitting Diode.

12. The system of claim 10, the illumination source further comprises at least one of wavelength-specific lighting, broad-band lighting, continuous lighting, strobed lighting, Kohler illumination, Abbe illumination, phase-contrast illumination, darkfield illumination, brightfield illumination and Epi illumination.

13. The system of claim 10, the illumination source further comprising at least one of coherent light, non-coherent light, visible light and non-visible light, the non-visible light being suitably matched to a sensor adapted for non-visible light.

14. The system of claim 11, the non-visible light further comprising at least one of infrared and ultraviolet wavelengths.

15. The system of claim 1, the sensor comprising at least one of digital sensor analog sensor, Charge Coupled Device (CCD) sensor, CMOS sensor, Charge Injection Device (CID) sensor, an array sensor, and a linear scan sensor and the system further comprising an illumination source to illuminate one or more non-luminous objects within the object field of view.

16. The system of claim 1, the sensor comprising at least one of a Charge Coupled Device (CCD) sensor, a CMOS sensor, and a Charge Injection Device (CID) sensor, and the system further comprising an illumination source to illuminate one or more non-luminous objects within the object field of view, the illumination source comprising at least one of coherent, light non-coherent light, visible light and non-visible light.

17. The system of claim 1, the image transfer medium providing a k-space filter that correlates a pitch associated with the one or more receptors to a diffraction-limited snot within the image transfer medium the pitch being unit-mapped to about the size of the diffraction-limited spot within the image transfer medium.

18. The system of claim 1, the image transfer medium providing a k-space filter that correlates a pitch associated with the one or more receptors to a diffraction-limited spot within the image transfer medium, the pitch being unit-mapped to about the size of the diffraction-limited spot within the image transfer medium, the sensor comprising at least one of a Charge Coupled Device (CCD) sensor, a CMOS sensor, and a Charge Injection Device (CID) sensor.

19. The system of claim 1, the image transfer medium providing a k-space filter that correlates a pitch associated with the one or more receptors to a diffraction-limited spot within the image transfer medium, the pitch being unit-mapped to about the size of the diffraction-limited spot within the image transfer medium, the image transfer medium enabling a working distance from an object plane to the image transfer medium of about 0.5 millimeters on and about 20 millimeters or less.

20. An image production method, comprising:

positioning a first lens toward a resolvable object in an object field of view;

positioning a second lens toward a sensor having one or more receptors; and sizing the first lens to have a focal length smaller than a focal length associated with the second lens to provide an apparent size reduction of the one or more receptors to about a size of a diffraction spot associated with the lenses.

21. The method of claim 20, the sensor comprising at least one of a digital sensor, an analog sensor, a Charge Coupled Device (CCD) sensor, a CMOS sensor, a Charge Injection Device (CID) sensor, an array sensor, and a linear scan sensor.

22. The method of claim 20, further comprising illuminating the object field of view.

23. The method of claim 22, wherein illuminating involves using at least one of coherent light, non-coherent light, visible light and non-visible light, the non-visible light being suitably matched to a sensor adapted for non-visible light.

24. The method of claim 22, wherein illuminating involves using at least one of wavelength-specific lighting, broad-band lighting, continuous lighting, strobed lighting, Kohler illumination, Abbe illumination, phase-contrast illumination, darkfield illumination, brightfield illumination, and Epi illumination.

25. The method of claim 22, wherein illuminating involves using at least one of infrared and ultraviolet wavelengths.

26. An imaging system, comprising:

a sensor associated with a plurality of pixels; and an optical component to virtually map the sensor and the plurality of pixels according to resolving characteristics of the optical component, the optical component comprising a multiple lens configuration, the multiple lens configuration further comprising a first lens positioned toward the object field of view and a second lens positioned toward the sensor, the first lens sized to have a focal length smaller than the second lens to provide an apparent reduction of the one or more receptors within the optical component.

27. The system of claim 26, the optical component providing a k-space filter that correlates a pitch associated with the one or more receptors to a diffraction-limited spot within the optical component, the pitch being unit-mapped to about the size of the diffraction-limited spot within the optical component.

28. An imaging system, comprising:

a sensor having one or more receptors; and an image transfer medium to scale the one or more receptors in accordance with resolvable characteristics of the medium, the image transfer medium comprising a multiple lens configuration the multiple lens configuration further comprising a first lens positioned toward the object field of view and a second lens positioned toward the sensor, the first lens sized to have a focal length smaller than the second lens to provide an apparent reduction of the one or more receptors within the image transfer medium.

29. The system of claim 28, the image transfer medium providing a k-space filter that correlates a pitch associated with the one or more receptors to a diffraction-limited spot within the image transfer medium, the pitch being unit-mapped to about the size of the diffraction-limited spot within the image transfer medium, the sensor comprising at least one of a Charge Coupled Device (CCD) sensor, a CMOS sensor, and a Charge Injection Device (CID) sensor.

30. An image production method, comprising:

positioning a first lens toward a resolvable object in an object field of view;

positioning a second lens toward a sensor having one or more receptors; and sizing the first lens to have a focal length smaller than a focal length associated with the second lens to provide an apparent size reduction of the one or more receptors within the object field of view, the apparent size reduction including an association between resolvable characteristics of at least one of the lenses and the one or more receptors.

31. The method of claim 30, the sensor comprising at least one of a digital sensor, an analog sensor, a Charge Coupled Device (CCD) sensor, a CMOS sensor, a Charge Injection Device (CID) sensor, an array sensor, and a linear scan sensor.

32. The method of claim 30, further comprising illuminating the object field of view.

33. The method of claim 32, wherein illuminating involves using at least one of coherent light, non-coherent light, visible light and non-visible light, the non-visible light being suitably matched to a sensor adapted for non-visible light.

34. An imaging system, comprising:

a sensor associated with a plurality of pixels; and an optical component to virtually map the sensor and the plurality of pixels to an object field a of view, the virtual mapping includes an association between a pixel size and resolvable characteristics of the optical component, the optical component comprising a multiple lens configuration, the multiple lens configuration further comprising a first lens positioned toward the object field of view and a second lens positioned toward the sensor, the first lens sized to have a focal length smaller than the second lens to provide an apparent reduction of the one or more receptors within the optical component.

35. The system of claim 34, optical component providing a k-space filter that correlates a pitch associated with the one or more receptors to a diffraction-limited spot within the optical component, the pitch being unit-mapped to about the size of the diffraction-limited spot within the image transfer medium, the sensor comprising at least one of a Charge Coupled Device (CCD) sensor, a CMOS sensor, and a Charge Injection Device (CID) sensor.

* * * * *